United States Patent [19]

Kuroda et al.

[11] Patent Number: 5,805,026
[45] Date of Patent: Sep. 8, 1998

[54] MICROSTRIPLINE RESONATOR USEABLE IN A VOLTAGE CONTROLLED OSCILLATOR AND METHOD FOR MAKING SAME

[75] Inventors: Yuji Kuroda; Yoshiaki Tanbo, both of Komatsu, Japan

[73] Assignee: Murata Manufacturing Co., Ltd., Nagaokakyo, Japan

[21] Appl. No.: 517,679

[22] Filed: Aug. 22, 1995

[30] Foreign Application Priority Data

Aug. 25, 1994 [JP] Japan .................................. 6-200930

[51] Int. Cl.⁶ ...................................................... H03B 5/18
[52] U.S. Cl. ...................... 331/96; 331/107 SL; 333/235; 333/205
[58] Field of Search ..................................... 333/235, 219, 333/246, 205; 331/107 SL, 96; 455/325, 327, 333

[56] References Cited

U.S. PATENT DOCUMENTS 5,187,451  2/1993  Nakamoto et al. ..................... 331/99
5,363,067  11/1994 Crandall et al. ................... 331/107 SL

*Primary Examiner*—Benny Lee
*Assistant Examiner*—Arnold Kinkead
*Attorney, Agent, or Firm*—Burns, Doane, Swecker & Mathis, LLP

[57] ABSTRACT

A microstripline resonator in which a desirable resonant frequency can be adjusted with less deterioration in Q and less production process steps is characterized in that a hollowed-out portion is formed in an electrode portion provided on an insulating substrate base. A width-narrowed portion is provided between the side edge of the electrode portion and the hollowed-out portion for adjusting the resonant frequency of the microstripline resonator.

23 Claims, 5 Drawing Sheets

MICROSTRIPLINE RESONATOR USEABLE IN A VOLTAGE CONTROLLED OSCILLATOR AND METHOD FOR MAKING SAME

BACKGROUND OF THE INVENTION

1. Field of the Invention

This invention relates to a microstripline resonator for use in a VCO (Voltage Control Oscillator) and the like.

2. State of the Art

An arrangement of a VCO in which a conventional microstripline resonator is applied is illustrated in FIGS. 4 and FIG. 5.

In FIG. 4, numeral 1 represents a microstripline resonator, 2a and 2b are switches, such as transistors, and numeral 3 is a variable capacitance diode. Numeral 4 represents an insulating substrate base. A grounding pattern is formed on a rear surface of the insulating substrate base 4; that is, on an opposite surface of the surface upon which the various components are mounted.

The components mounting surface is connected to the grounding pattern through a plurality of through-holes 5.

FIG. 5 is a circuit diagram of the VCO wherein the microstripline resonator is applied. An oscillator circuit is constructed by connecting capacitors 6, 7, 8, and the variable capacitance diode 3 to an input side of the microstripline resonator 1, and also by connecting a capacitor 9 and the transistors 2a, 2b to an output side of the microstripline resonator 1, respectively.

In the conventional microstripline resonator 1 of the VCO, as shown in FIG. 6(a), a plate-like electrode portion la is provided on a surface of the insulating substrate base 4.

In order to adjust the resonant frequency of the resonator 1, removed portions lb, as shown in FIG. 6(b) and FIG. 6(c), are formed by router functional trimming such that parts of the electrode portion la are removed by trimming from the edge portion to the center portion thereof, whereby the resonant frequency of the microstripline resonator 1 is adjusted to a desired resonant frequency.

However, the conventional microstripline resonator has problems as described below.

Firstly, when the removed portions lb are formed in the electrode portion la of microstripline resonator 1 by router functional trimming, surfaces of the removed portions lb become uneven. Thereby the deterioration in Q (quality factor) of the microstripline resonator 1 can be increased. For example, if a resonant frequency is adjusted by 40 MHz, the C/N (Carrier to Noise Ratio) characteristic of the VCO deteriorates to 1.3 dB because of the deterioration in Q.

Secondly, where the resonant frequency needs to be significantly adjusted, the number of the removed portions lb will increase, whereby the number of steps in the manufacturing process will be increased.

SUMMARY OF THE INVENTION

In order to solve the problems described above, it is an object of the invention to provide a microstripline resonator in which the total dimension of the removed portions in the electrode portion is shortened, whereby deterioration in Q of the microstripline resonator is decreased and the number of manufacturing process steps is further decreased.

An exemplary microstripline resonator embodying this invention, with which the above and other objects can be accomplished, can be characterized as comprising an insulating substrate base on which an electrode portion is provided, a hollowed-out portion provided in the electrode portion, and a width-narrowed portion provided between a side edge of said electrode portion and said hollowed-out portion for adjusting the resonant frequency of the microstripline resonator.

An alternate embodiment of a microstripline resonator embodying this invention can be characterized in that the said hollowed-out portion of the microstripline resonator is one of a plurality of hollowed-out portions.

An alternate embodiment of a microstripline resonator embodying this invention can be characterized in that a size of at least one of said plurality of hollowed-out portions is different from those of the other hollowed-out portions.

In an exemplary embodiment of a microstripline resonator embodying this invention, the resonant frequency is adjusted by cutting the width-narrowed portion provided between the side edge of the electrode portion and the hollowed-out portion, whereby the resonant frequency of the microstripline resonator can be adjusted with less deterioration in Q and less manufacturing process steps.

BRIEF DESCRIPTION OF THE DRAWINGS

The accompanying drawings, which are incorporated in and form a part of this specification, illustrate exemplary embodiments of the invention, and together with the description, serve to explain the principles of the invention In the drawings.

DETAILED DESCRIPTION OF THE PREFERRED EMBODIMENTS

Figure 4:
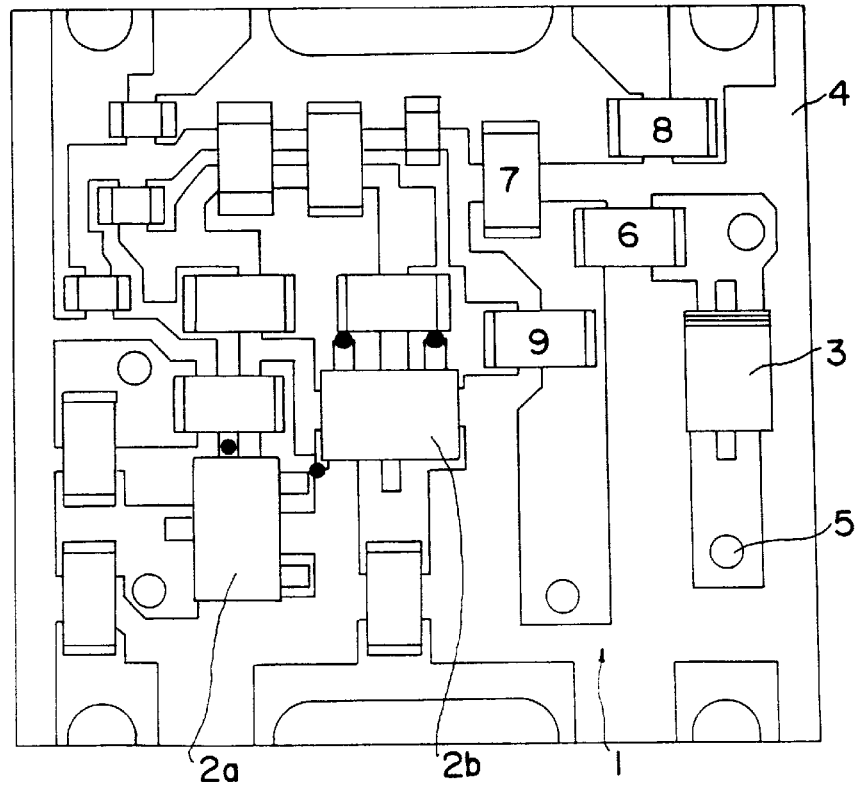
FIG. 4 is a view showing a structure of a VCO using a conventional microstripline resonator.
Figure 5:
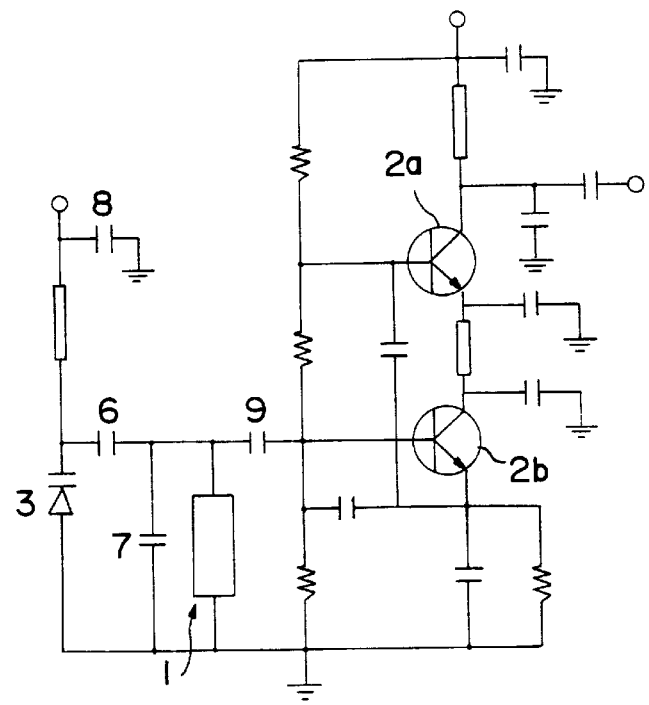
FIG. 5 is a circuit diagram of a conventional VCO.
Figure 6A:
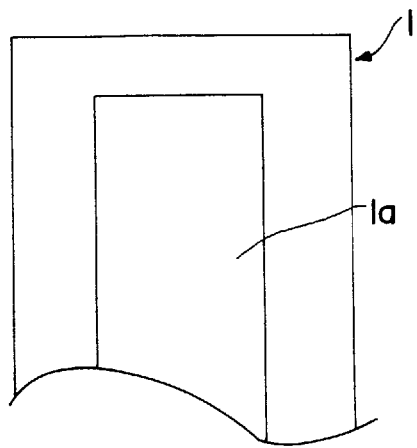
FIGS. 6(a), 6(b) and 6(c) are partial enlarged views of the microstripline resonator in FIG. 4.
Figure 6B:
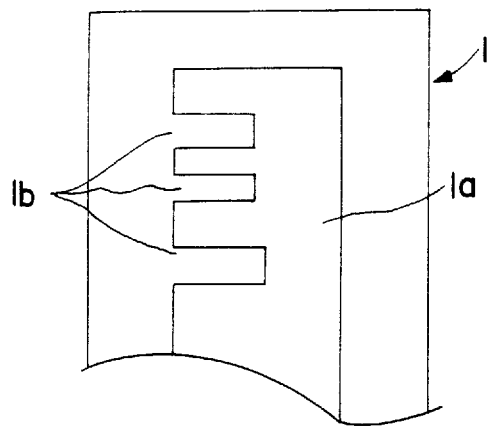
Figure 6C:
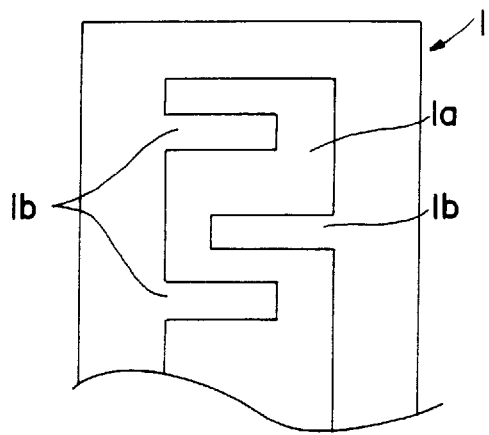

As the first embodiment of this invention, a structure of a microstripline resonator and that of a VCO in which said microstripline is used, are described with reference to FIGS. 1–3. The basic structure of the VCO is similar to that of the conventional VCO shown in FIGS. 4 and 5. Components which are substantially identical or at least similar to each other are indicated by the same numerals or denotations, and an explanation thereof is omitted.

Figure 1:
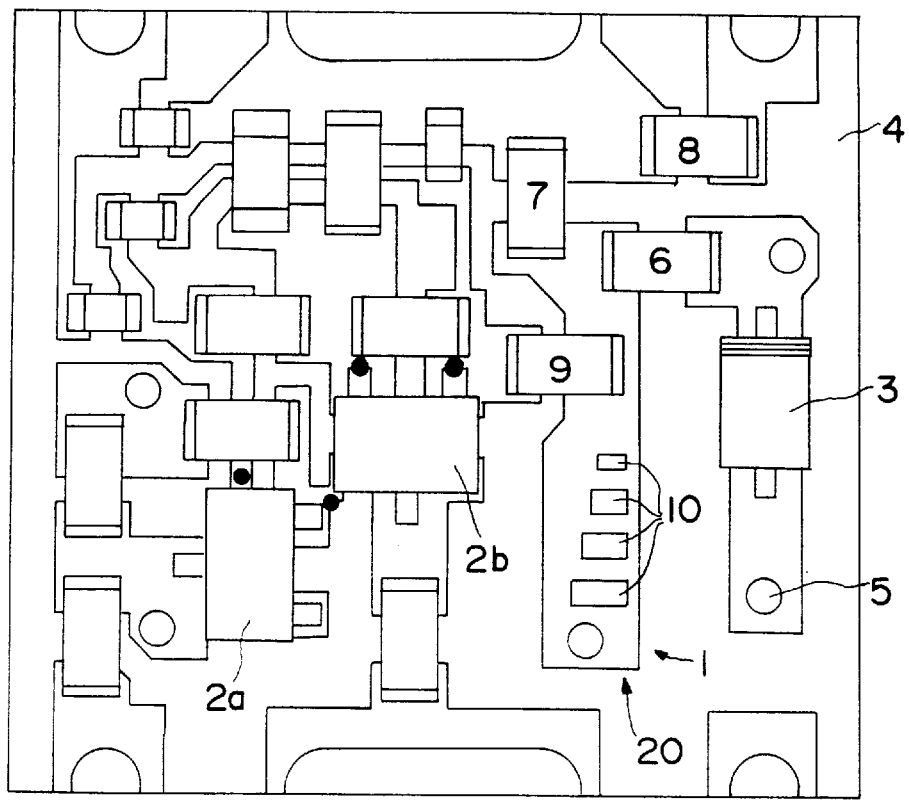
FIG. 1 is a view showing an exemplary structure of a VCO using a microstripline resonator embodying the present invention.
Figure 2:
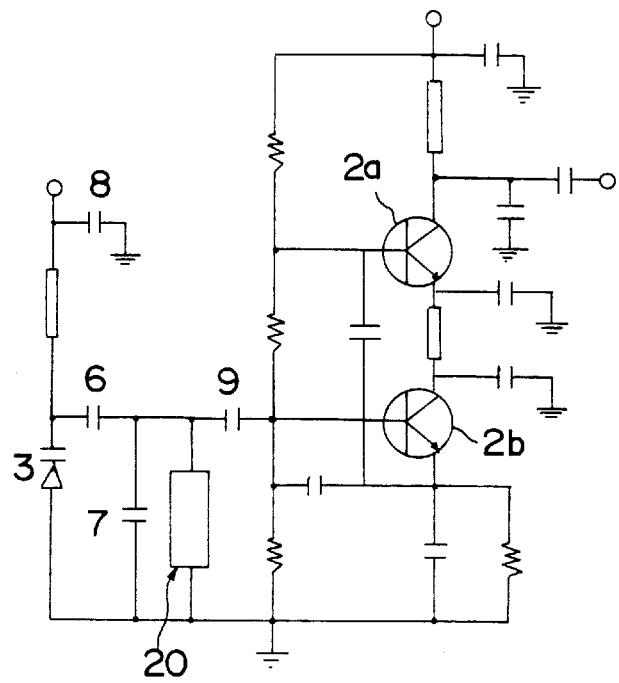
FIG. 2 is an exemplary circuit diagram of a VCO embodying the present invention.

FIG. 1 is a view showing an exemplary structure of the VCO using a microstripline resonator embodying the present invention. FIG. 2 is an exemplary circuit diagram of the VCO embodying the present invention. FIG. 3 is a partial enlarged view of the microstripline resonator in FIG. 1.

In FIG. 1, an insulating substrate base 4 can be, for example, made of glass-epoxy resin, and an electrode portion 20 is formed on the insulating substrate base 4 using, for example, copper foil by photoetching.

Figure 3:
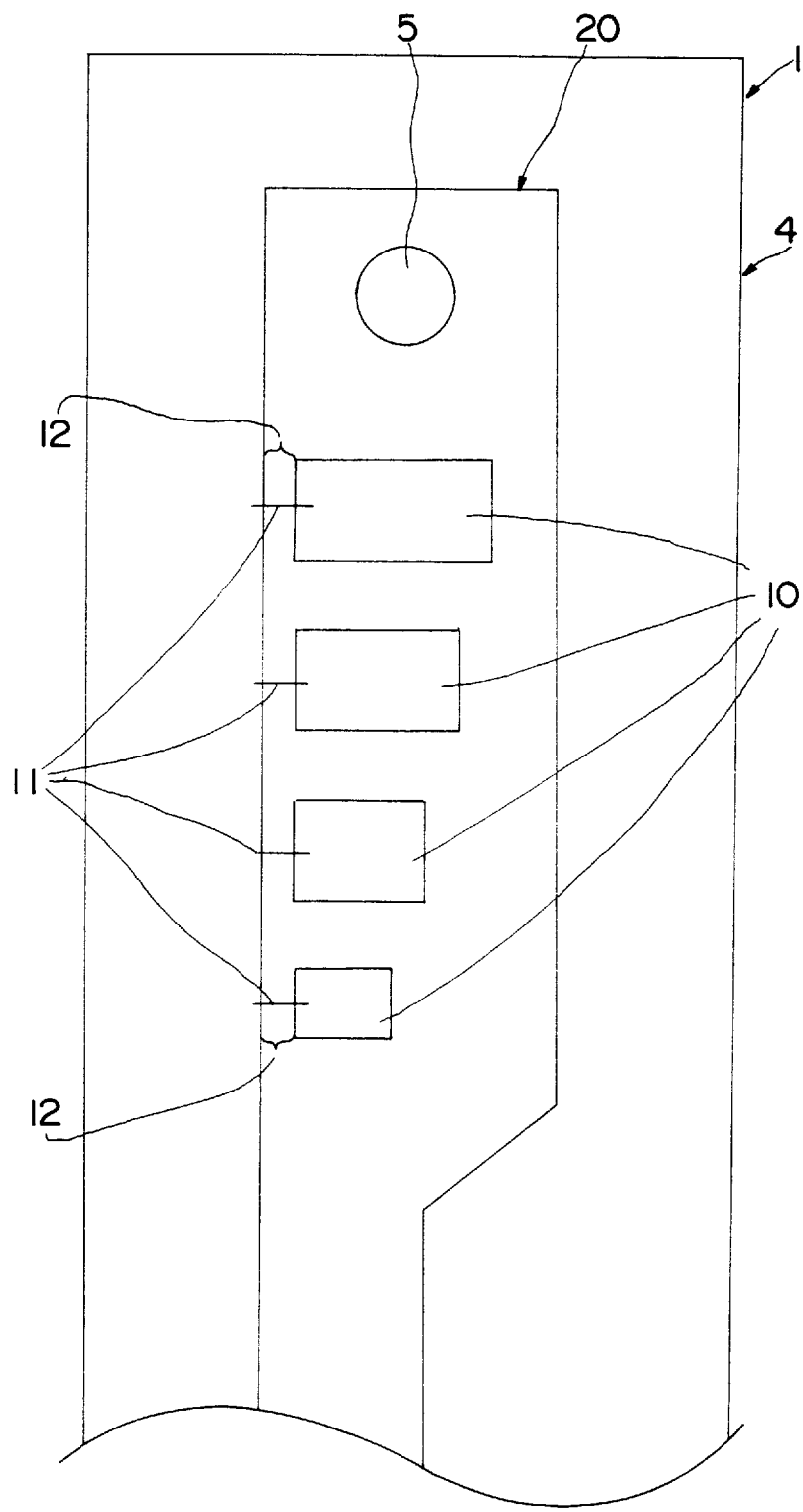
FIG. 3 is a partial enlarged view of the microstripline resonator in FIG. 1.

As is shown in FIG. 3, four hollowed-out portions 10 are formed in the electrode portion 20 formed on the insulating substrate base 4. However, those skilled in the art will appreciate that any number of hollowed-out portions can be used. The hollowed-out portions 10 are preformed by, for example, photoetching, and can each be formed of the same size or of different sizes. The hollowed-out portions can be formed in any desired shape. A through-hole, or via, 5 can also be provided through the electrode portion 20. Width-narrowed portions 12 are provided between the side edge of the electrode portion 20 and the hollowed-out portions 10 so that the resonant frequency of the microstripline resonator 1 can be adjusted appropriately.

Thus, the resonant frequency of the microstripline resonator can be adjusted beforehand by utilizing the electrode portion 20 comprising both the hollowed-out portions 10 and width-narrowed portions 12. To adjust the resonant frequency, cut portions 11 are made in the width-narrowed portions 12 by cutting from the side edge of the electrode portion 20 toward the hollowed-out portions 10 using, for example, router functional trimming. Thereby, the total dimension of cutting, that is, the dimension from the side edge of the electrode portion 20 to the hollowed-out portions 10, can be shortened considerably, whereby the deterioration in Q of the microstripline resonator 1 is reduced.

Figure 7:
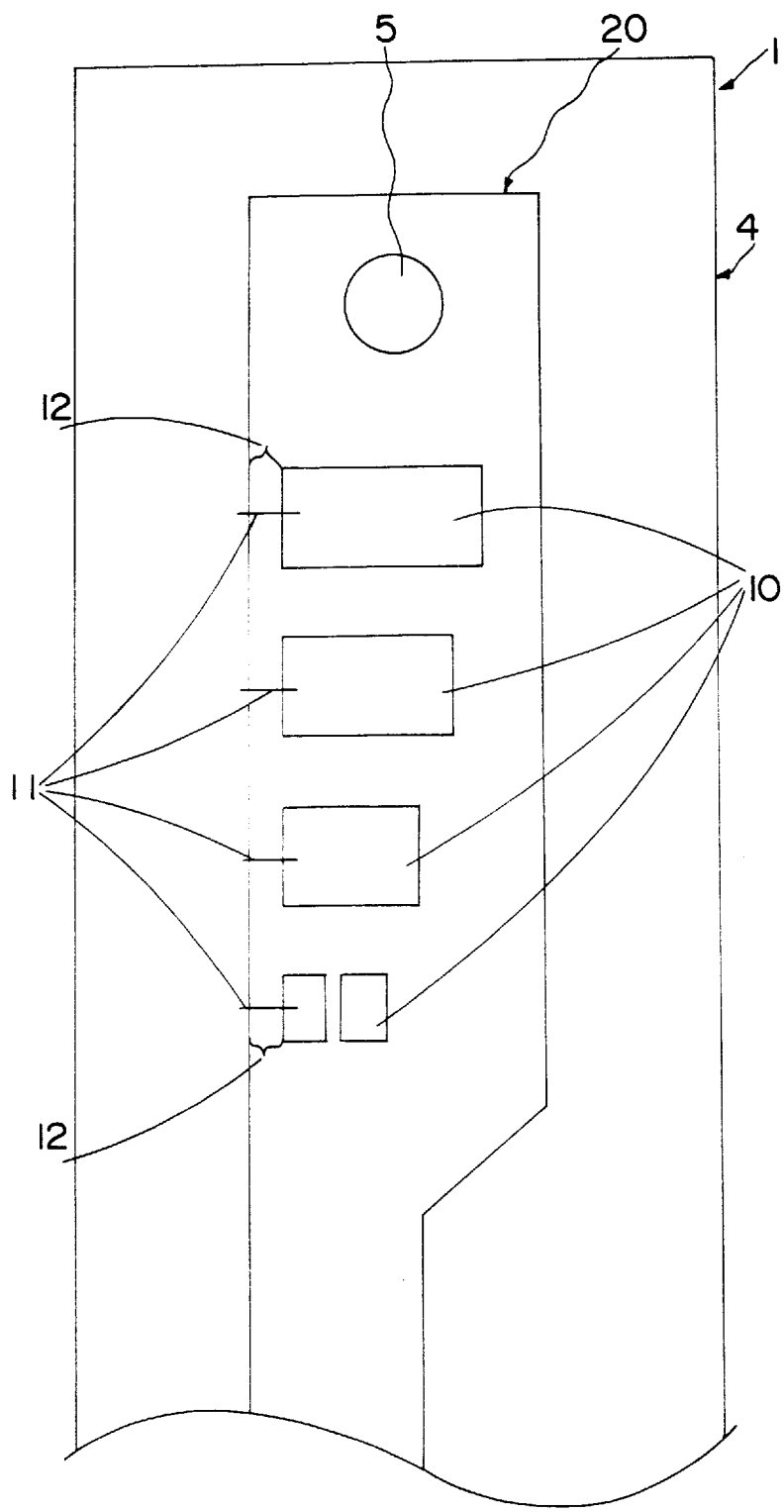
FIG. 7 is an alternate embodiment of a microstripline resonator embodying the present invention.

In the foregoing embodiments of this invention, four hollowed-out portions 10 are provided. Preferably, when one of the hollowed-out portions 10 is divided into two or more parts each of which is separated by an electrode portion 20, with a cut from a side edge of the electrode portion 20 to at least one of the divided parts as is shown in FIG. 7, the C/N characteristic can be further improved.

As explained above, an advantage according to this invention is as follows:

First, since the microstripline resonator comprises the hollowed-out portions and the width-narrowed portions, a desired resonant frequency can be obtained by cutting only the width-narrowed portions of the electrode portion in the microstripline resonator. As a result, the total dimension of cutting for adjusting the resonant frequency can be shortened. A microstripline resonator can therefore be provided that can suppress the C/N characteristic of the VCO due to deterioration in Q of the microstripline resonator. In the case of adjusting the resonant frequency by 40 MHz for example, the deterioration of C/N can be suppressed to about 0.7 dB or less in the present invention, as opposed to, for example, 2.0 dB in a conventional prior art microstripline resonator.

Secondly, since the microstripline resonator comprises the hollowed-out portions, the production time including the resonant frequency adjustment process can be greatly reduced. For example, production time can be decreased from 1,000 pieces in 250 minutes to 1,000 pieces in 180 minutes or less.

Thirdly, laser trimming was not suitable as a trimming method for a conventional microstripline resonator because it would cause the deterioration of C/N by, for example, 2.2 dB. However, in the present invention, laser trimming can be used to produce the relatively short cuts for adjusting the resonate frequency and thereby provide the same advantages as router functional trimming, such that both methods of trimming can be applied to the microstripline resonator. Moreover, this microstripline resonator has a more preferable C/N characteristic, when applied in the VCO.

It will be appreciated by those skilled in the art that the present invention can be embodied in other specific forms without departing from the spirit or essential characteristics thereof. The presently disclosed embodiments are therefore considered in all respects to be illustrative and not restricted.

The scope of the invention is indicated by the appended claims rather than the foregoing description and all changes that come within the meaning and range and equivalence thereof are intended to be embraced therein.

What is claimed is:

1. A microstripline resonator comprising:
   an insulating substrate base;
   an electrode portion formed as a strip having an outer perimeter provided on said insulating substrate base;
   a hollowed-out portion provided within said perimeter of said electrode portion; and
   a width-narrowed portion of said electrode portion for adjusting a resonant frequency of the microstripline resonator by changing a width of the resonator, said width-narrowed portion being provided between a side edge of said electrode portion and said hollowed-out portion;
   wherein at least one cut is provided in said width-narrowed portion to adjust said resonant frequency.

2. A microstripline resonator according to claim 1, wherein said hollowed-out portion includes a plurality of hollowed-out portions.

3. A microstripline resonator according to claim 2, wherein a size of at least one of said plurality of hollowed-out portions is different from a size of another of said plurality of hollowed-out portions.

4. A microstripline resonator according to claim 1, wherein said insulating substrate base is made of glass-epoxy resin.

5. A microstripline resonator according to claim 4, wherein said electrode portion is formed using copper foil.

6. A microstripline resonator according to claim 1, wherein said hollowed-out portion is formed by removing portions of said electrode portion.

7. A voltage-controlled oscillator comprising:
   at least one switch;
   at least one diode; and
   a microstripline resonator electrically connected with said at least one transistor and said at least one diode, said at least one transistor, said at least one diode and said microstripline resonator being formed on at least one side of an insulating substrate base; and
   a grounding pattern formed on at least a second side of said insulating substrate base, said second side being opposite said first side, said microstripline resonator further comprising:
     an electrode portion formed as a strip having an outer perimeter provided on said insulating substrate base;
     a hollowed-out portion provided within said perimeter of said electrode portion; and
     a width-narrowed portion of said electrode portion for adjusting a resonant frequency of the microstripline resonator by changing a width of the resonator, said width-narrowed portion being provided between a side edge of said electrode portion and said hollowed-out portion;
   wherein at least one cut is provided in said width-narrowed portion to adjust said resonant frequency.

8. A voltage controlled oscillator according to claim 7, wherein said hollowed-out portion includes a plurality of hollowed-out portions.

9. A voltage controlled oscillator according to claim 8, wherein a size of at least one of said plurality of hollowed-out portions is different from a size of another of said plurality of hollowed-out portions.

10. A voltage controlled oscillator according to claim 7, wherein said hollowed-out portion is formed by removing portions of said electrode portion.

11. A method for producing a microstripline resonator comprising the steps of:
   forming an electrode portion as a strip having an outer perimeter on an insulating substrate base;
   forming a hollowed-out portion within said perimeter of said electrode portion;
   forming a width-narrowed portion of said electrode portion for adjusting a resonant frequency of the microstripline resonator by changing a width of the resonator, said width-narrowed portion being provided between a side edge of said electrode portion and said hollowed-out portion; and
   adjusting a resonant frequency of the microstripline resonator by cutting at least a portion of the width-narrowed portion.

12. A method according to claim 11, wherein said step of forming a hollowed-out portion further includes a step of:
   forming a plurality of hollowed-out portions.

13. A method according to claim 11, wherein said step of forming an electrode portion further includes a step of:
   photoetching a copper foil formed on said insulating substrate base.

14. A method according to claim 11, wherein said step of cutting further includes the step of:
   using router functional trimming to cut said width-narrowed portion.

15. A method according to claim 11, wherein said step of cutting further includes the step of:
   using laser trimming to cut said width-narrowed portion.

16. A method according to claim 11, wherein said step of forming said hollowed-out portion further includes a step of:
   dividing said hollowed-out portion into parts during said step of forming said hollowed-out portion.

17. A method according to claim 12, further including a step of:
   forming said insulating substrate base using glass-epoxy resin, and forming said electrode portion using copper foil.

18. A microstripline resonator according to claim 1, wherein said at least one cut is provided in said width-narrowed portion from said side edge of said electrode to said hollowed-out portion, wherein said cut is substantially perpendicular to said side edge.

19. A microstripline resonator according to claim 18, wherein said at least one cut removes a part of said width-narrowed portion, and leaves another part of said width-narrowed portion intact.

20. A voltage controlled oscillator according to claim 7, wherein said at least one cut is provided in said width-narrowed portion from said side edge of said electrode toward said hollowed-out portion, wherein said cut is substantially perpendicular to said side edge.

21. A voltage controlled oscillator according to claim 20, wherein said at least one cut removes a part of said width-narrowed portion, and leaves another part of said width-narrowed portion intact.

22. A method according to claim 11, wherein said adjusting step further comprises:
   adjusting a resonant frequency of the microstripline resonator by cutting at least a portion of the width-narrowed portion from said side edge to said hollowed-out portion, wherein said cut is substantially perpendicular to said side edge.

23. A method according to claim 22, said at least one cut removes a part of said width-narrowed portion, and leaves another part of said width-narrowed portion intact.

* * * * *